United States Patent [19]

Hamada et al.

[11] Patent Number: 4,469,978
[45] Date of Patent: Sep. 4, 1984

[54] ELECTRODE ARRANGEMENT FOR A FOLDED POLYMER PIEZOELECTRIC ULTRASONIC DETECTOR

[75] Inventors: Akira Hamada; Akira Funakoshi; Keiichi Ohira, all of Fukushima, Japan

[73] Assignee: Kureha Kagaku Kogyo Kabushiki Kaisha, Tokyo, Japan

[21] Appl. No.: 529,616

[22] Filed: Sep. 6, 1983

[30] Foreign Application Priority Data

Sep. 6, 1982 [JP] Japan .................. 57-154781

[51] Int. Cl.³ .................................. H01L 41/08
[52] U.S. Cl. ........................... 310/366; 310/331; 310/334; 310/335; 310/338; 310/800
[58] Field of Search .............. 310/334, 335, 336, 337, 310/338, 800, 365, 366, 339, 331, 332; 179/110 A; 340/365 A

[56] References Cited

U.S. PATENT DOCUMENTS 4,028,566  6/1977  Franssen .................. 310/800 X
4,071,785  1/1978  Yoshida et al. ............ 310/800 X
4,330,730  5/1982  Kurz et al. ............... 310/800 X
4,413,202 11/1983  Krempl et al. ............ 310/800 X

FOREIGN PATENT DOCUMENTS 0031298  2/1982  Japan ...................... 310/800

Primary Examiner—Mark O. Budd
Attorney, Agent, or Firm—Woodcock, Washburn, Kurtz, Mackiewicz & Norris

[57] ABSTRACT

An ultrasonic detector is provided wherein electrodes are formed on the front and rear surfaces of a high polymer piezoelectric film, such that opposing electrode portion and nonopposing electrode portions are alternately and continually formed, most parts of the electrodes on the front and rear surfaces being opposed to each other through the piezoelectric film at the opposing electrode portions, most parts of the electrodes on the front and rear surfaces of the film which are different from the most parts of the electrodes at the opposing electrode portions being shifted from each other at the nonopposing electrode portions so as to have substantially no capacitance, and the piezoelectric film is wound around a base in an even number of layers such that the opposing electrode portions overlap each other and the nonopposing electrode portions overlap each other.

5 Claims, 12 Drawing Figures

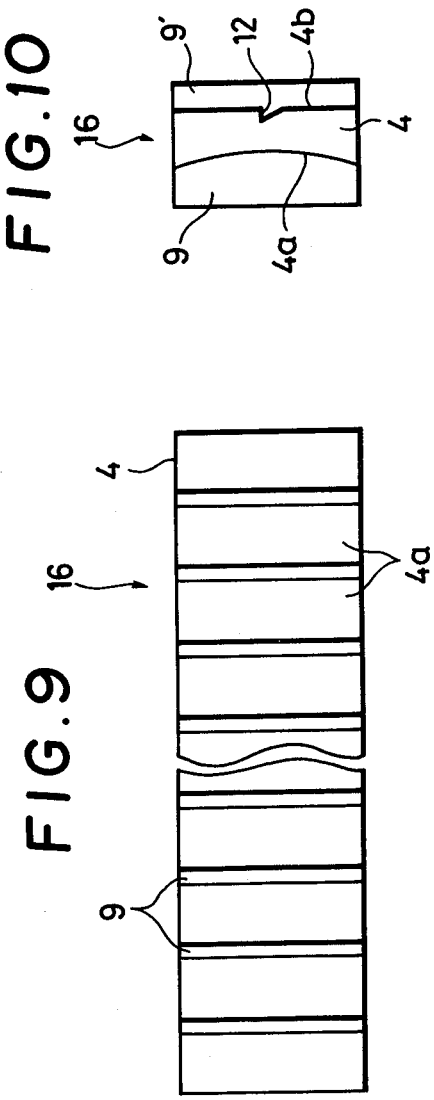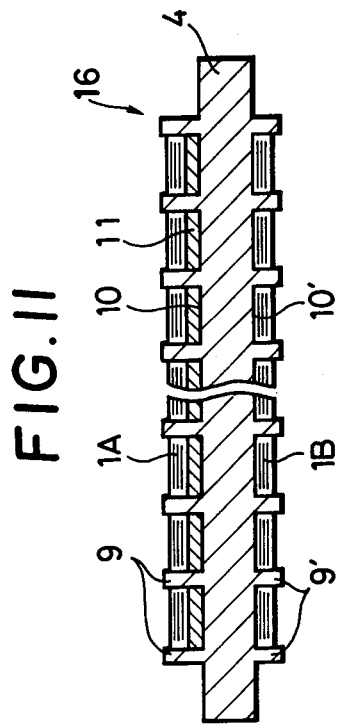

ELECTRODE ARRANGEMENT FOR A FOLDED POLYMER PIEZOELECTRIC ULTRASONIC DETECTOR

BACKGROUND OF THE INVENTION

1. Field of the Invention

The present invention relates to an ultrasonic detector and, more particularly, to a structure of an ultrasonic detector consisting of multilayered high polymer piezoelectric films.

2. Description of the Prior Art

A high polymer piezoelectric material is easy to form into any shape or size due to the properties of a high polymer and has a lower acoustic impedance than that of a ceramic piezoelectric material. Accordingly, a high polymer piezoelectric material is useful for an ultrasonic detector for industrial or medical applications. However, a high polymer such as a polymer, e.g, vinyl fluoride, vinylidene fluoride or ethylene trifluoride as preferable piezoelectric materials; or a copolymer has an extremely high inherent electric resistance as compared to a ceramic piezoelectric material such as PZT. For this reason, in a detector which uses a thick film of a high polymer piezoelectric material, a drive voltage produced from a drive oscillator must be very high, presenting problems in cost and safety.

A higher resolution is obtained if the wavelength of ultrasonic waves for ultrasonic image pickup or ultrasonic detection is short. On the other hand, if the wavelength of ultrasonic waves is short, attenuation of waves due to absorption through various media such as water or human body is enhanced. This prevents detection in a deep region from the surface. Accordingly, an optimal wavelength (frequency) must be selected for each image pickup or detection. The oscillation frequency of an ultrasonic image pickup device is frequently obtained by pulse oscillation at the resonant frequency of a piezoelectric element as a detector. If the material of the piezoelectric element to be pulse oscillated is uniform, the resonant frequency of the piezoelectric element is inversely proportional to its thickness. This means that once the material of a piezoelectric element and the optimal wavelength are determined, the thickness of the piezoelectric element is determined.

As has been mentioned above, if a thick detector consists of a single high polymer piezoelectric film, the electric impedance of the film becomes extremely high. Then, the voltage of the oscillator must also be rendered high.

In view of this problem, as shown in FIG. 1, it is known to stack a plurality of high polymer piezoelectric thin films 1 through electrodes 2 and 3 such that the same poles thereof face each other as indicated by arrows. These electrodes 2 and 3 are connected to an oscillator OSC through lead wires. As shown in FIG. 2, it is also known to fold back and forth a single high polymer pizeoelectric film 1 having electrodes 2 and 3 on its front and rear surfaces. In the examples shown in FIGS. 1 and 2, the voltage required for driving each piezoelectric film is low. At the same time, a resultant detector has an inherent oscillation corresponding to the thick stack of films. Such examples are known, for example, in 1978 Ultrasonic Symposium Proceedings, IETE cat, #78CH, 1344-ISU.

In the example shown in FIG. 1, if the stacked detector is small, connection of a lead wire from each electrode 2 or 3 between stacked piezoelectric films 1 is cumbersome. Especially in the case of an array detector wherein a number of unit wave incident/exit surfaces comprising elongated piezoelectric materials is formed in an array, each unit piezoelectric element is very small. Accordingly, if each unit element is to be stacked and a lead wire is to be connected between each pair of adjacent stacked films, wiring is cumbersome and short-circuiting easily occurs due to entanglement of wires in a narrow space.

In the example shown in FIG. 2, since the respective layers comprise a single film, electrode wiring need only be connected to the electrode portions from the front and rear surfaces of the uppermost and lowermost films. Accordingly, wiring labor is significantly reduced as compared with the example shown in FIG. 1, and wire entanglement is not caused. However, if a film having electrodes adhered on its two surfaces is folded into a multiple of layers, the electrodes tend to be separated at the folded corners and disconnection tends to be caused.

It is also proposed to leave each folded corner of the structure as shown in FIG. 2 rounded as shown in FIG. 3 so that the electrodes are not easily separated. However, if a folded corner is left rounded in this manner, round portion C comprises a single piezoelectric film. Then, piezoelectric oscillation (elongation/contraction oscillation in addition to thickness oscillation) at the portion C introduces noise and increases power loss of the oscillator.

SUMMARY OF THE INVENTION

It is the first object of the present invention to provide an ultrasonic detector which does not require a high drive voltage.

It is the second object of the present invention to provide an ultrasonic detector which may have any desired resonant frequency by winding a high polymer piezoelectric film with electrodes adhered on its two surfaces around a base and changing the number of turns of the piezoelectric film.

It is the third object of the present invention to provide an ultrasonic detector which allows easy wiring of lead wires.

It is the fourth object of the present invention to provide an array-type ultrasonic detector which is easy to manufacture.

It is the fifth object of the present invention to provide an ultrasonic detector which has a high output power and which produces little noise.

BRIEF DESCRIPTION OF THE DRAWINGS

FIG. 9 is a plan view showing an embodiment of a base of an array-type ultrasonic detector according to the present invention;

FIG. 10 is a side view of the base shown in FIG. 9; and

FIG. 11 is a sectional, front view of the array-type ultrasonic detector.

DETAILED DESCRIPTION OF THE PREFERRED EMBODIMENTS

Figure 1:
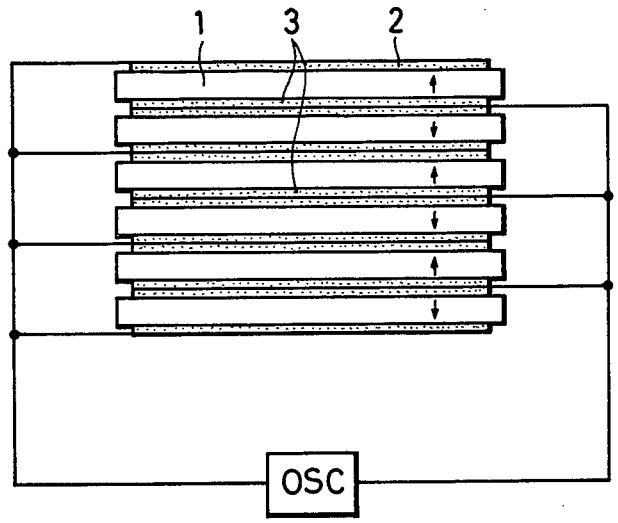
FIG. 1 is a side view showing a conventional example.
Figure 2:
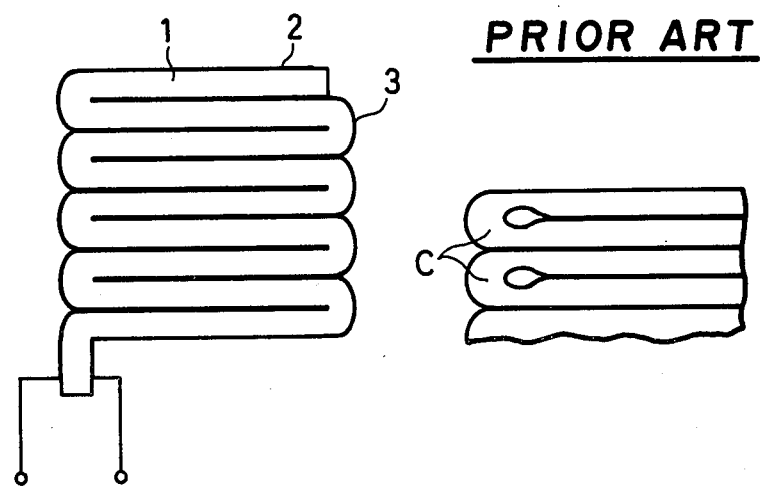
FIG. 2 is a side view showing another conventional example.
Figure 3:
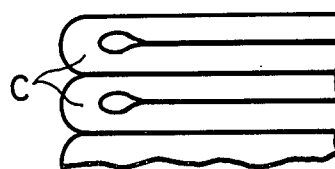
FIG. 3 is a side view showing the main part of still another conventional example.
Figure 4:
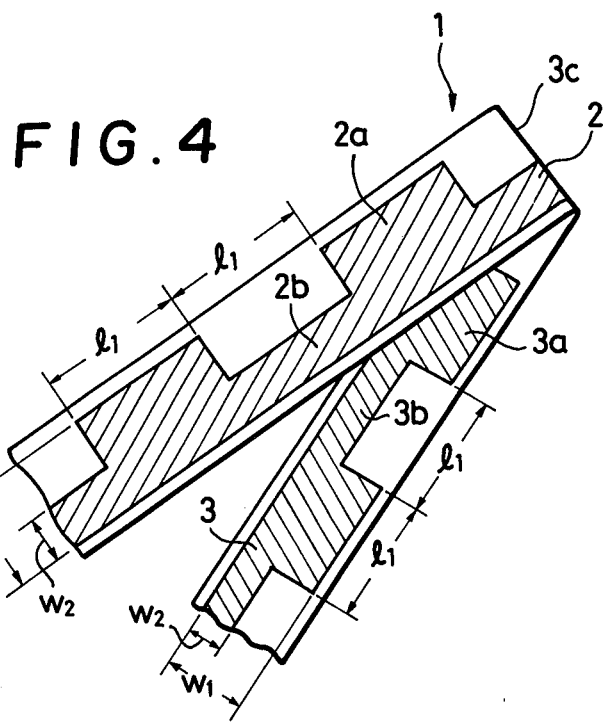
FIG. 4 is a perspective view showing an embodiment of a piezoelectric film according to the present invention.
Figure 5:
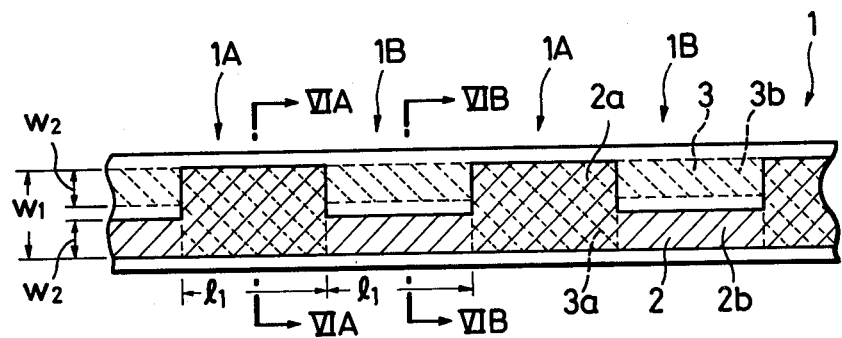
FIG. 5 is a plan view of the piezoelectric film.

Referring to FIGS. 4 and 5, electrodes 2 and 3 are continuously formed on the two surfaces of a piezoelectric film 1 of a piezoelectric material such as polyvinylidene fluoride along the longitudinal directions. The electrode 2 consists of an electrode 2a having a length l1 and a width w1, and another electrode 2b having the same length l1 and a width w2 (where w2<w1). The electrode 3 consists of an electrode 3a having the length l1 and the width w1 and another electrode 3b having the length l1 and the width w2. The film 1 of this embodiment is folded along folding lines formed along the direction of its width.

Figure 6A:
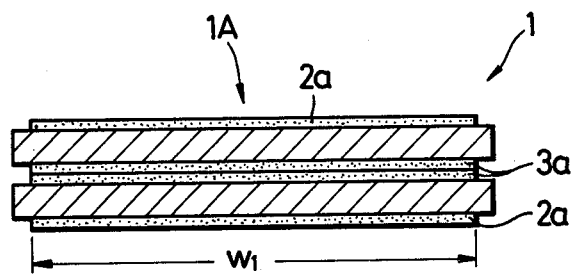
FIGS. 6A and 6B are sectional views along the lines VIA—VIA and VIB—VIB in FIG. 5.
Figure 6B:
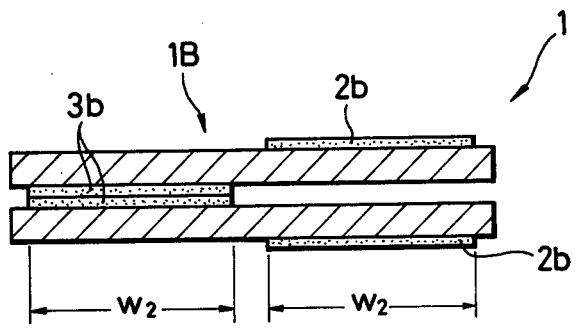

FIGS. 6A and 6B show the film 1 in its folded state. Referring to FIG. 6A, the electrodes 2a and 3a on the two surfaces of the film 1 overlap each other. In this case, the electrodes 2a and 3a need not completely oppose each other as shown in FIG. 6A; most parts of them need only oppose each other. Referring to FIG. 6B, the electrodes 2b and 3b on the two surfaces of the film 1 are shifted from each other. In this case, the electrodes 2b and 3b need not be completely shifted from each other; they may partially overlap.

In the structure as described above, in an opposing electrode portion 1A as shown in FIG. 6A, most parts of the electrodes 2a and 3a overlap each other. Accordingly, if a voltage is applied across the electrodes 2 and 3, the portion 1A of the film 1 causes thickness oscillation. When the film 1 oscillates, this portion 1A serves as a piezoelectric active portion from which the potential difference between the electrodes 2 and 3 is obtained. This portion 1A also has a high capacitance. Meanwhile, in a nonopposing electrode portion 1B shown in FIG. 6B, most parts (or entire parts) of the electrodes 2b and 3b on the two surfaces of the film 1 are shifted from each other. Accordingly, the portion 1B has almost no capacitance. The portions 1A and 1B are alternately and continually formed in the film 1 shown in FIG. 5.

Figure 7:
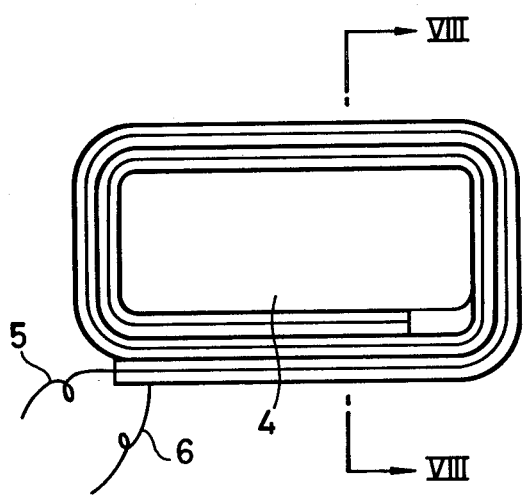
FIG. 7 is a plan view of an embodiment of an ultrasonic detector according to the present invention.
Figure 8:
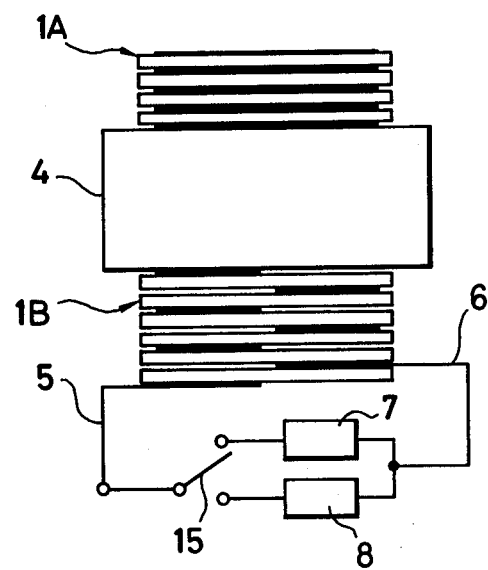
FIG. 8 is a sectional view along the line VIII—VIII of FIG. 7.

The film 1 is wound around a base 4 in two layers or any other even number of layers, as shown in FIGS. 7 and 8. In this case, the film 1 is wound such that the portions 1A overlap each other and the portions 1B also overlap each other. The opposing surfaces of the overlapping portions 1A serve as piezoelectric active portions. Lead wires 5 and 6 connected to the electrode 2 and 3 are selectively connected to an oscillator 7 and a signal processor 8 through a switch 15. As described above, two or any other even number of layers of the film 1 are wound; one layer means a single film 1. Accordingly, if the film is used as folded in FIG. 4, two layers are formed. If electrodes are formed on two surfaces of a single film and the film is wound, the electrodes on the two surfaces are short-circuited. However, if the film 1 as shown in FIG. 4 is used, electrodes of the same polarity oppose each other. More specifically, the film 1 is folded such that the electrodes 2 oppose each other and the electrodes 3 oppose each other. Accordingly, the electrodes 2 and 3 may not cause short-circuiting. If the layers of the film 1 are wound securely, no special adhesive need be used. However, an adhesive may be applied between each pair of adjacent layers of the film 1, as needed.

A wave reflecting plate of a metal or the like may be formed on the surface of the base 4, and the opposing electrode portion 1A of the film 1 may be overlaid thereover. In this case, the thickness of the wave reflecting plate is preferably ¼ the wavelength of the ultrasonic waves used. When the plate has such a thickness, the waves reflected by the plate are superposed on the waves radiated from the piezoelectric material and enhanced.

FIGS. 9 to 11 show an embodiment of an array-type ultrasonic detector according to the present invention.

Referring to FIGS. 9 to 11, a base 4 of a phenolic resin has a length of 150 mm, a width of 11 mm, and a thickness of 5 mm. Primary concave surfaces 4a are formed on the surface of the base 4 so as to have a radius of curvature of 70 mm in the direction of its width. Projections 9 and 9' each having a width of 0.1 mm and respectively numbering 101 are formed on each surface of the base 4 at intervals of 1.1 mm along the longitudinal direction of the base 4.

Thus, these projections 9, 9 and 9', 9' define therebetween vertically opposed grooves 10 and 10' numbering 100 each. Reflecting plates 11 of copper having a thickness of 180 μm, a width of 1 mm and a length of 10.5 mm are received in the respective grooves 10. Recesses 12 for securing fixing one end of the piezoelectric film 1 are formed in the grooves 10'.

A film 1 comprising a piezoelectric polyvinylidene fluoride film having a thickness of 9 μm and a width of 1.0 mm and being constructed as shown in FIG. 4 is wound in each of the grooves 10 and 10'. In this case, the opposing electrode portions 1A overlap each other in the groove 10 while the nonopposing electrode portions 1B overlap each other in the groove 10'. The film 1 is wound, for example, five times (10 layers) after adhering one end of the film 1 in the recess 12. In the case of this film 1, the electrodes 2 and 3 respectively comprise a nickel film of 800 Å thickness and a gold film of 1,600 Å thickness which are both formed by evaporation. The films have a length l1 of about 10 mm and widths w1 and w2 of about 0.5 mm and about 0.25 mm, respectively.

A low-viscosity epoxy resin is applied on the grooves 10, and a silicone rubber is placed thereover. Vacuum pressing is then performed, and the silicone rubber and the opposing electrode portion 1A of the film 1 are adhered together. Subsequently, lead wires consisting of silver wires having a diameter of 50 μm are soldered to the electrodes 2b and 3b which are at the terminal end of the film 1 wound in each rear groove 10'. The projections 9 and 9' may be omitted. In this case, the piezoelectric film to be wound may have substantially the same width as the length of the base. Furthermore, the electrode on the front surface of the piezoelectric film 1 comprises a number of strips parallel to each other in the winding direction. The respective strips are spaced apart from each other at equal intervals.

The array-type ultrasonic detector 16 has a resonant frequency of about 5 MHz and can operate with high efficiency.

According to an ultrasonic detector of the present invention, a high polymer piezoelectric film 1 with electrodes adhered on its two surfaces need only be wound around a base. Accordingly, a detector having a desired resonant frequency may be obtained by simply changing the number of turns of the film. This particularly facilitates manufacture of an assembly of compact unit piezoelectric elements as in an array-type ultrasonic detector. In addition to this, for wiring of the respective unit elements, the wiring may be connected to the nonopposing electrode portion 1B at the end of the respective high polymer piezoelectric film 1. Wiring process is thus simplified and wire entanglement may not occur. The nonopposing electrode portion 1B has substantially no capacitance. Accordingly, the electric pulse energy transmitted from the oscillator is almost consumed in the piezoelectric active portion 1A at which the electrodes oppose each other, so that a high output wave can be obtained.

What is claimed is:

1. An ultrasonic detector wherein electrodes are formed on front and rear surfaces of a high polymer piezoelectric film, such that opposing electrode portion and nonopposing electrode portions are alternately and continually formed, most parts of the electrodes on the front and rear surfaces being opposed to each other through said piezoelectric film at said opposing electrode portions, most parts of said electrodes on the front and rear surfaces of said film which are different from the most parts of the electrodes at said opposing electrode portions being shifted from each other at said nonopposing electrode portions so as to have substantially no capacitance, and said piezoelectric film is wound around a base in an even number of layers such that said opposing electrode portions overlap each other and said nonopposing electrode portions overlap each other.

2. An ultrasonic detector according to claim 1, wherein a reflecting plate is disposed on said base, and said opposing electrode portion is formed on said reflecting plate.

3. An ultrasonic detector according to claim 1 or 2, wherein said opposing electrode portions overlap each other at a plurality of positions on said base.

4. An ultrasonicdetector according to claim 2, wherein said reflecting plate has a thickness which is ¼ a wavelength of ultrasonic waves used.

5. An ultrasonic detector according to claim 1 or 2, wherein a plurality of grooves are formed on each of the front and rear surfaces of said base, said opposing electrode portions overlap each other in each of said grooves on the front surface, and said nonopposing electrode portions overlap each other in each of said grooves on the rear surface.

* * * * *